US006981879B2

(12) United States Patent
Kuczynski et al.

(10) Patent No.: US 6,981,879 B2
(45) Date of Patent: Jan. 3, 2006

(54) LAND GRID ARRAY (LGA) INTERPOSER WITH ADHESIVE-RETAINED CONTACTS AND METHOD OF MANUFACTURE

(75) Inventors: Joseph Kuczynski, Rochester, MN (US); Timothy Jerome Tofil, Rochester, MN (US); Paul Alan Vermilyea, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/803,634

(22) Filed: Mar. 18, 2004

(65) Prior Publication Data

US 2005/0208785 A1  Sep. 22, 2005

(51) Int. Cl.
*H01R 12/00* (2006.01)
(52) U.S. Cl. ...................................... 439/66
(58) Field of Classification Search ................. 439/66, 439/91
See application file for complete search history.

(56) References Cited

U.S. PATENT DOCUMENTS

| | | | | |
|---|---|---|---|---|
| 4,701,279 | A | * | 10/1987 | Kawaguchi et al. ......... 252/511 |
| 4,988,306 | A | * | 1/1991 | Hopfer, III et al. ........... 439/66 |
| 6,106,305 | A | * | 8/2000 | Kozel et al. .................. 439/66 |
| 6,247,938 | B1 | * | 6/2001 | Rathburn ..................... 439/66 |
| 6,264,476 | B1 | | 7/2001 | Li et al. |
| 6,315,576 | B1 | * | 11/2001 | Neidich ....................... 439/66 |
| 6,528,984 | B2 | | 3/2003 | Beaman et al. |
| 6,787,709 | B2 | * | 9/2004 | Vinther ....................... 174/260 |
| 2001/0001748 | A1 | | 5/2001 | Ochiai |
| 2001/0020546 | A1 | | 9/2001 | Eldridge et al. |
| 2001/0024892 | A1 | | 9/2001 | Ochiai |
| 2003/0003784 | A1 | | 1/2003 | Neidich |
| 2003/0146510 | A1 | | 8/2003 | Chien |

FOREIGN PATENT DOCUMENTS

JP  11-31541 A  2/1999

OTHER PUBLICATIONS

IBM Technical Disclosure Bulletin, vol. 33, No. 5, Oct. 1990, "Compressible-Contact Interconnection Scheme" by K. J. Puttlitz and H. Wenskus, pp. 394-395.

* cited by examiner

*Primary Examiner*—Ross Gushi
(74) *Attorney, Agent, or Firm*—Rabin & Berdo, P.C.

(57) ABSTRACT

A novel Land Grid Array (LGA) interposer with adhesive-retained contacts and method of manufacture provide improved reliability in LGA mounting applications. A flexible adhesive is used to secure LGA interposer contacts to the walls of voids through an interposer frame. The contacts may be spring contacts or "fuzz button" type contacts. The use of a flexible adhesive provides for floating movement of the contacts within the voids so that thermal expansion stresses do not cause unbalanced compression of the contacts that could otherwise occur with a fixed attachment of the contacts to the frame. The resulting interposer can provide reliable electrical connection from LGA lands on an integrated circuit package to lands on an electronic assembly that is highly tolerant of thermal expansion differences, while eliminating migration of the contacts out of the voids that could otherwise cause shorting or disconnection.

9 Claims, 3 Drawing Sheets

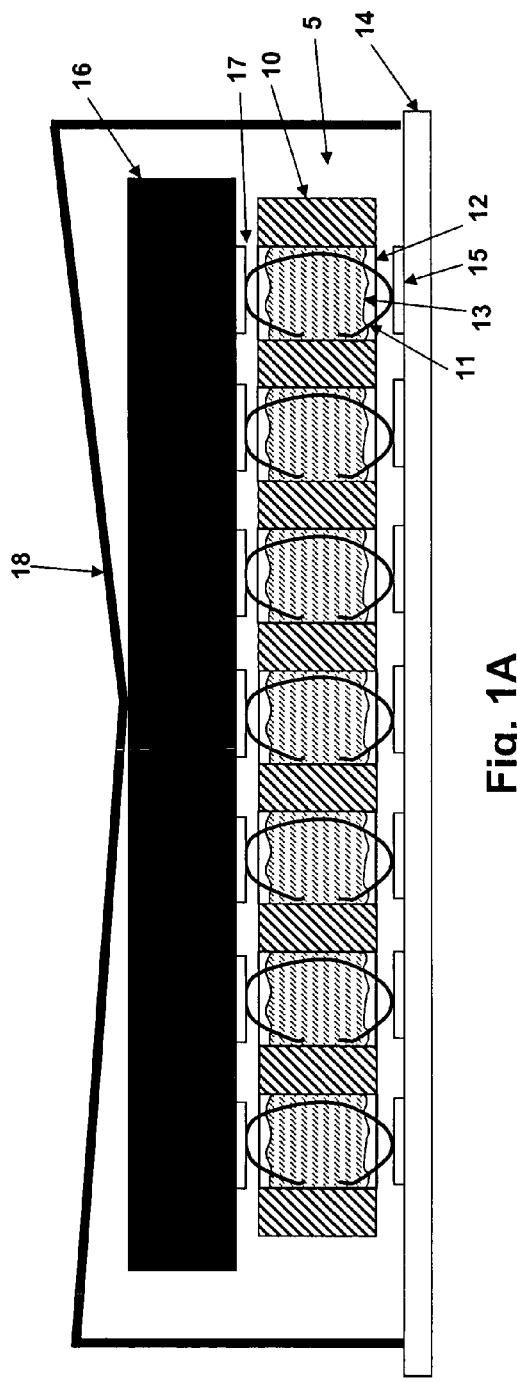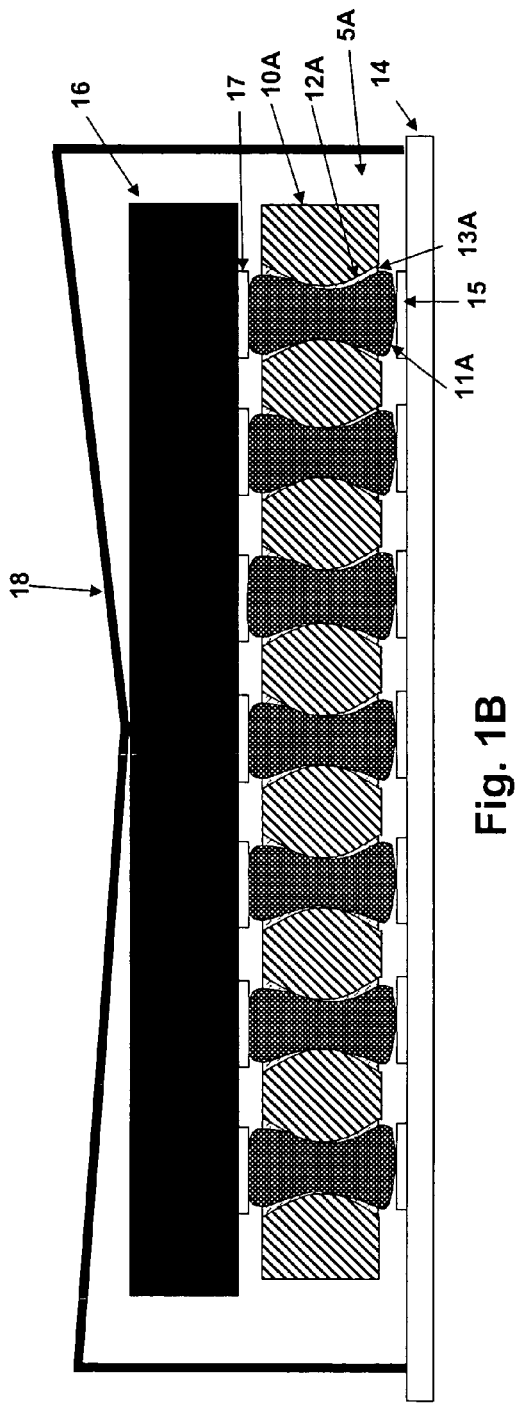
Fig. 1A
Fig. 1B

LAND GRID ARRAY (LGA) INTERPOSER WITH ADHESIVE-RETAINED CONTACTS AND METHOD OF MANUFACTURE

BACKGROUND OF THE INVENTION

1. Field of the Invention

The present invention relates generally to integrated circuit mounting systems, and more particularly, to an interposer for mounting Land Grid Array (LGA) integrated circuits to an electronic assembly and a method of manufacturing the interposer.

2. Background Information

Land Grid Array (LGA) integrated circuits are in widespread use in electronic systems. The LGA interconnect scheme provides a high interconnect-density electronic interface that also provides a highly-reliable socket interconnect structure that permits mounting of semiconductor packages having a large thermal expansion with respect to an electronic assembly mounting area such as a Printed Circuit Board (PCB). For example, ceramic semiconductor packages generally have a much lower coefficient of thermal expansion than PCBs and so typical solder-ball mounting such as with Ball Grid Array (BGA) leads to fracture of the solder ball connections when temperatures vary widely, causing failure of the electronic system.

The LGA interconnect also permits interchangeable integrated circuit mounting without using pin-based interconnects. For example, in present-day computing systems, processing components are often mounted using a socket configuration rather than mounted via a solder interconnect so that the processing components may be selected and installed after an electronic assembly such as a "motherboard" has been fabricated.

In order to provide a reliable and low resistance electrical connection between the LGA integrated circuit and an electronic assembly such as a printed wiring board (PWB), LGA interposers have been developed that typically use a loaded spring contact or a "fuzz button" contact at each contact position that extend from the lands on the integrated circuit to a land on the electronic assembly. Both types of contacts in present use are typically gold-plated to provide a low-resistance connection that is resistant to environmental degradation such as oxidation.

The fuzz buttons or spring contacts are inserted into a mounting frame that is generally a rectangular plastic interposer frame having circular holes at each contact position. After the contacts are inserted, the interposer assembly is complete. In use, the interposer is placed and aligned between the LGA integrated circuit and the electronic assembly and the LGA integrated circuit is secured with a mounting mechanism that applies pressure between the LGA integrated circuit and the electronic assembly. The pressure compresses the fuzz buttons or spring contacts, providing a reliable electrical interconnect between the LGA lands on the integrated circuit and the lands on the electronic assembly.

However, the retention of either fuzz button contacts or spring contacts in the interposer frame has presented a manufacturing and post-manufacturing handling and reliability problem, as the contacts may fall out of or move from their proper positions in the interposer frame during handling of the interposer or assembly of the LGA to the electronic assembly. Even after assembly, vibration or other stresses may cause movement of the contacts causing a failed interconnect or a short due to lateral contact of the LGA interposer contacts above or below the surfaces of the interposer frame.

Also, rigid securing of LGA interposer contacts is not desirable, as ideally, the contacts should be permitted to "float" so that thermal expansion differences between the LGA integrated circuit package and the electronic assembly do not cause an interconnect failure due to compression unloading of one end of a contact or possible overloading and deformation of a contact that will subsequently disconnect when the temperature changes. One securing scheme that has been implemented for retaining LGA contacts uses hourglass-profiled voids in the interposer frame into which the contacts are inserted. The "neck" points of the voids slightly compress the contacts laterally, so that the contacts are more securely retained in the interposer frame. However, the contacts may still move or fall out of the interposer if sufficient force is applied.

Therefore, it would be desirable to provide a mechanism and method of manufacture for securely retaining both fuzz button and spring contacts in a LGA interposer frame that still allows the contacts to float.

SUMMARY OF THE INVENTION

The objective of providing a secure mechanism for retaining LGA interposer contacts in an interposer frame is accomplished in a new LGA interposer and method of manufacture.

The interposer includes an interposer frame having a grid of holes that may be cylindrical or may have other profiles. A contact, which may be a spring contact or a fuzz button type contact is inserted in each hole and is secured with an elastomeric adhesive. The elastomeric adhesive provides sufficient flexibility so that the contacts may still float in response to an applied force, providing a secure electrical connection, but prevents permanent migration of the contacts from the desired position. In the case of spring contacts, a self-healing adhesive may be deposited within the holes and the spring contacts inserted after curing of the adhesive.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

FIG. 1A is a pictorial diagram depicting a cross-section of an LGA interposer assembly in accordance with an embodiment of the present invention.

FIG. 1B is a pictorial diagram depicting a cross-section of an LGA interposer assembly in accordance with another embodiment of the present invention.

DETAILED DESCRIPTION OF THE PREFERRED EMBODIMENTS

Figure 2B:
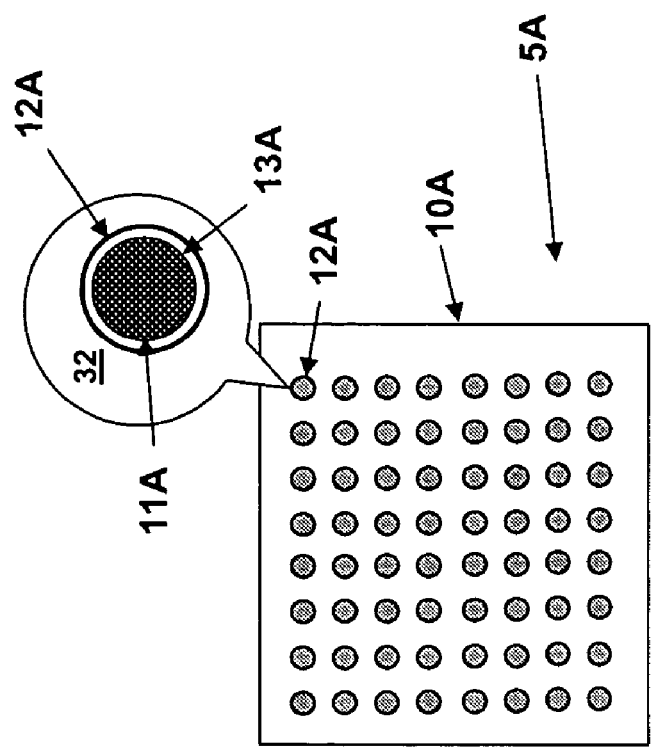
FIG. 2B is a pictorial diagram depicting a perspective view and detail of LGA interposer 5 of FIG. 1B.

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

The present invention is directed toward an interposer for land grid array (LGA) semiconductor package mounting that provides improvement in retention of contacts within the interposer frame.

With reference now to the figures, and in particular with reference to FIG. 1A, there is depicted an LGA interposer 5 in accordance with an embodiment of the present invention. Interposer 5 is used to interconnect a semiconductor package 16 having a plurality of LGA terminals 17 to lands 15 on a system substrate 14, such as a printed circuit board. Interposer 5 provides electrical connection between each of LGA terminals 17 and a corresponding land 15 via a plurality of electrically-conductive contacts 11. In the depicted embodiment, contacts 11 are c-shaped spring contacts formed from stamped, bent and plated metal. Contacts 11 are held in position along the plane of the grid array by an interposer frame 10 that has a through-hole (void) 12 for each contact 11 and into which each contact 11 is inserted. Pressure is provided between semiconductor package 16 and system substrate 14 by a clamping arrangement such as spring clip 18. The pressure on contacts 11 causes compression of contacts 11, providing a secure electrical connection.

However, as described above with respect to the prior art, contacts 11 may not be under uniform pressure, are subject to vibration and may move prior to securing interposer 5 between semiconductor package 16 and system substrate 14, causing contacts 11 to fall out completely or extend so far as to bend and cause intermittent connections, missing connections or shorts to adjacent contacts. If contacts 11 were rigidly secured to interposer frame 10, differential thermal expansion or differences in mechanical pressure across interposer 5 could lead to missed wiping of contacts 11 on lands 17 or 15. Therefore, an elastic adhesive 13 is introduced to retain contacts 11 within holes 12 so that contacts 11 may move in a direction perpendicular to the primary plane of interposer frame 10 while keeping contacts 11 from falling out or moving far enough to cause shorting to adjacent contacts or lands.

Elastic adhesive 13 is generally a silicone or urethane adhesive that is either a two-part adhesive mixed at the time of application, or may be a UV or temperature curable adhesive.

While the above-described use of LGA interposer 5 is in a connection between an LGA semiconductor package and a printed circuit board land pattern, it should be understood that other LGA or grid array applications are possible such as board-to-board interconnects. Further, while LGA is a particular technology subject to certain standards in the art, it should be understood that the present invention applies to interposers and sockets having floating contacts that are not typically mechanically secured to the frame in order to provide a wide range of thermal and pressure variation between two subsystems that are connected. The present invention provides a means and method by which such interposer and socket systems may be improved in reliability and ease of handling/installation.

Referring now to FIG. 1B, there is depicted a Land Grid Array (LGA) interposer 5A in accordance with another embodiment of the present invention. As described above with respect to FIG. 1A, Interposer 5A is used to interconnect a semiconductor package 16 having a plurality of LGA terminals 17 to lands 15 on a system substrate 14, such as a printed circuit board. Interposer 5A provides electrical connection between each of LGA terminals 17 and a corresponding land 15 via a plurality of electrically-conductive contacts 11A. In the depicted embodiment, contacts 11A are "fuzz buttons" formed from a single strand of molybdenum wire spun into a compressible cylindrically-shaped electrically conductive contact. Contacts 11A are held in position along the plane of the grid array by an interposer frame 10A that has a through-hole (void) 12A for each contact 11A and into which each contact 11A is inserted. Holes 12A are depicted as having an hourglass-shaped cross-section that is typically used to improve retention of contacts 11A. However, with the advantages of the present invention, it is not necessary to provide such an hourglass profile in order to retain contacts 11A, although assembly may be simplified. As in the embodiment depicted in FIG. 1A, pressure is provided between semiconductor package 16 and system substrate 14 by a clamping arrangement such as spring clip 18. The pressure on contacts 11A causes compression of contacts 11A, providing a secure electrical connection.

However, as described above with respect to FIG. 1A, contacts 11A may not be under uniform pressure, are subject to vibration and may move prior to securing interposer 5A between semiconductor package 16 and system substrate 14, causing contacts 11A to fall out completely or extend so far as to bend and cause intermittent connections, missing connections or shorts to adjacent contacts. Further, fuzz button contacts such as contacts 11A can be deformed or may actually unwind, increasing the likelihood of shorting if an end of the wire forming a fuzz button leaves the area of void 12A. Elastic adhesive 13A is introduced to retain contacts 11A within holes 12A so that contacts 11A retain their shape and do not unwind. Also, elastic adhesive 13A provides movement in a direction perpendicular to the primary plane of interposer frame 10A while keeping contacts 11A from falling out or moving far enough to cause shorting to adjacent contacts or lands. The combination of preventing unwinding and restricting movement of fuzz button contacts 11A, substantially eliminates the possibility of shorting due to migration or unwinding of contacts 11A.

Figure 2A:
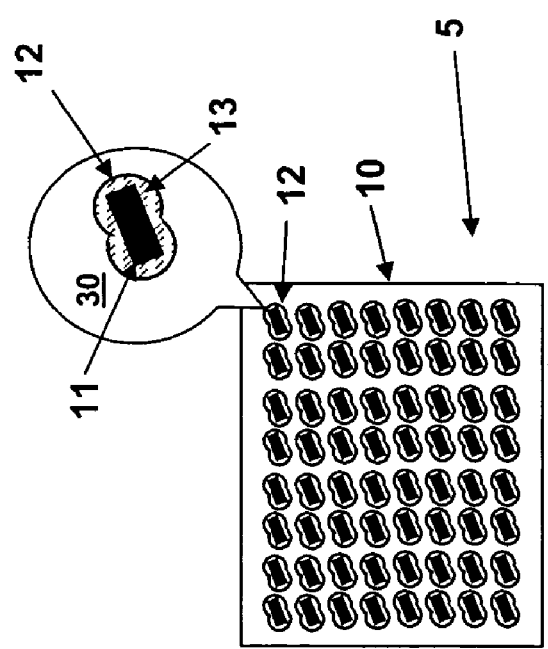
FIG. 2A is a pictorial diagram depicting a perspective view and detail of LGA interposer 5 of FIG. 1A.

Referring now to FIG. 2A, interposer 5 is shown in further detail. In the depiction, the location of holes 12 through interposer frame 10 forming a grid array can be seen. Callout 30 shows a magnified detail of a contact 11 secured by adhesive 13 within hole 12. While holes 12 are of a dumbbell shape for accepting c-shaped spring contacts 11, it should be understood that the shape of holes 12 is incidental to the purpose of the present invention, although in the depicted embodiment, the dumbbell-shaped holes may provide better retention of contacts 11 by adhesive 13 when adhesive is disposed within the body of contacts 11 by shortening the distance between the body of contacts 11 and the walls of holes 12.

For spring contact interposers in accordance with the present invention such as interposer 5, interposer frame 10 may be prepared with elastic adhesive 13 prior to insertion of contacts 11. By using a self-healing adhesive compound and curing the compound prior to insertion of contacts 11, contacts 11 may be retained by insertion displacement of adhesive 13 without adhesive 13 adhering (bonding) to contacts 11. Adhesive 13 may be applied via a paste and wipe operation, but may be alternatively applied only within interposer frame 10 by injection in a central portion of holes 12 so that adhesive 13 does not reach the top or bottom surface of interposer frame 10. Alternatively, contacts 11 may be inserted through uncured adhesive 13 that has been injected into holes 12 and adhesive then cured, so that adhesive 13 adheres to contacts 11.

As another alternative, interposer 5 may be assembled by loading contacts 11 in holes 12 and then injecting adhesive 13 in holes 12 in order to bond adhesive 13 to both the inner walls of holes 12 and to contacts 11. Generally, for a c-shaped contact 11 such as those depicted in FIG. 1A, adhesive 13 is injected so that the central void in the body of contact 11 is filled with adhesive 13 that is also bonded to the walls of hole 12. However, adhesive 13 may be applied only to the periphery of hole 12 or a portion thereof that is adjacent a surface of contact 11, depending on the amount of resistance to displacement of contact 11 that is needed.

Referring now to FIG. 2B, interposer 5A is shown in further detail. In the depiction, the location of holes 12A through interposer frame 10A forming a grid array can be seen. Callout 32 shows a magnified detail of a contact 11A secured by adhesive 13A within hole 12A.

For fuzz button contact interposers in accordance with the present invention such as interposer 5A, interposer 5A may be assembled by loading contacts 11A in holes 12A and then injecting adhesive 13A in holes 12A in order to bond adhesive 13A to both the inner walls of holes 12A and to contacts 11A. Alternatively, adhesive may be injected into holes 12A and contacts 11A inserted before curing adhesive 13A. Generally, for a fuzz button contact 11A, adhesive 13A is injected around the periphery of the walls of hole 12 at least near the surfaces of the interposer frame 10A, which helps maintain the shape of contacts 11A as described above. The above-described process can be performed on prefabricated fuzz button interposers. However, adhesive 13A may be applied only to the interior of hole 12A, depending on the amount of resistance to displacement of contact 11A that is needed and the amount of control of the shape of contact 11A near the outside surfaces of interposer frame 10A.

Figure 3:
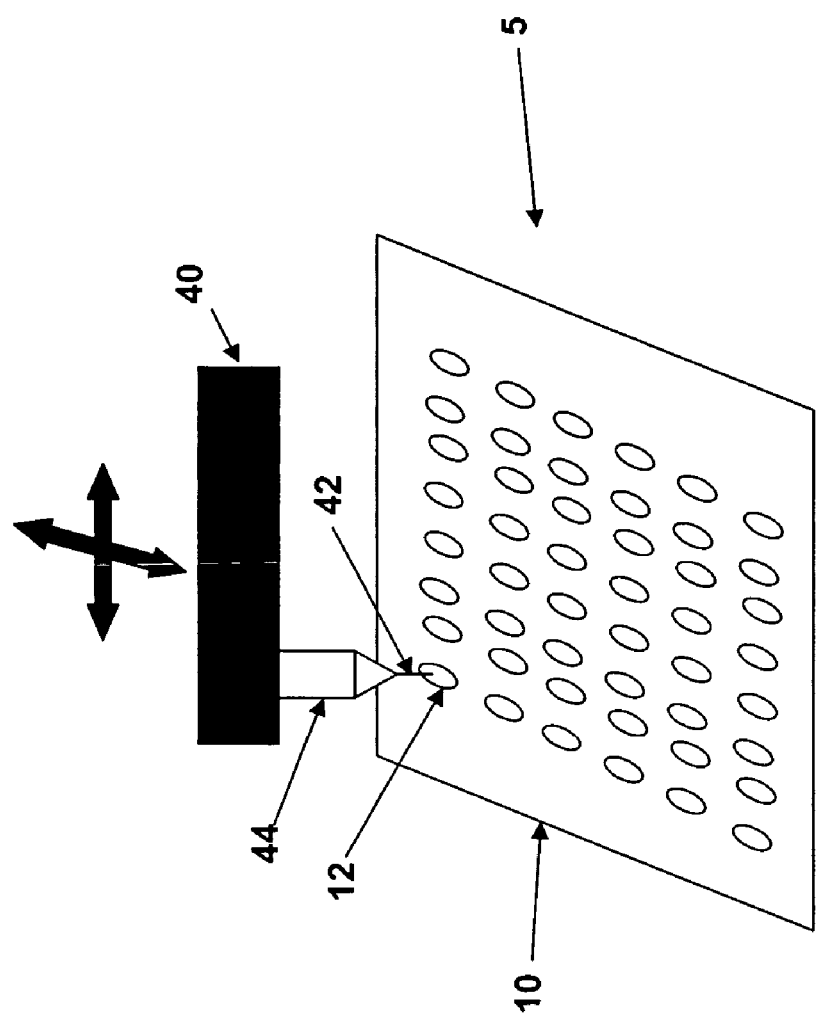
FIG. 3 is an illustration depicting a manufacturing process for making an LGA interposer in accordance with an embodiment of the present invention.

Referring now to FIG. 3, the methods of manufacture of the various interposers described above are illustrated. An adhesive dispensing system is used to introduce elastic adhesive into interposer frame 10 holes 12. Interposer frame 10 is generally held in an X-Y positioning table with a fixed dispensing needle location or may be held in a fixed position and the dispensing needle is moved as will be illustrated. The adhesive dispensing system comprises a positioner 40 for moving a dispenser 44 that terminates in a needle 42 for injecting adhesive into holes 12. By controlling the position of needle 42 and amount of adhesive dispensed at each hole 12 the proper amount of resistance to displacement (and deformation in the case of fuzz button contacts) can be maintained. When adhesive is injected prior to insertion of contacts, a needle of appropriate size for quickly filling each hole 12 to between 10% and 100% of the hole volume at each step position (hole location) of positioner 40 is used. An adhesive of fairly high viscosity is used to retain the adhesive in holes 12 prior to curing. But, when injecting adhesive after insertion of contacts, a small needle (approximately 30 ga) is used so that adhesive can be injected around or into the contacts. A low viscosity adhesive is also necessary when contacts are pre-inserted so that the adhesive can wick into the open volumes within holes 12.

It should be understood, however, that the invention is not necessarily limited to the specific process, arrangement, materials and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. An interposer for providing electrical connections between lands of a Land Grid Array (LGA) device and corresponding lands of an electronic assembly, said interposer comprising:
    an interposer frame comprising a substantially planar insulating sheet defining dumbell-shaped voids through said insulating sheet perpendicular to a primary plane of the interposer frame, said voids provided for the insertion of contacts spaced in a grid-array;
    a plurality of flexible C-shaped metal conductive contacts each having an arcuate first contact end and an arcuate second contact end, and wherein said contacts are inserted within and through the voids defined by said interposer frame such that said first contact extends above a top surface of said interposer frame and said second contact extends below a bottom surface of said interposer frame, and a gap of the C-shape is between the top surface and the bottom surface; and
    an elastic disposed between said contacts and said interposer frame and adhered to said interposer frame, whereby said contacts are mechanically retained to said interposer frame by said elastic which permits travel of said contacts in a direction perpendicular to said interposer frame via flexure of said elastic.

2. The interposer of claim 1, wherein said elastic is disposed completely around a periphery of a portion of said voids and said contacts, said portion being located within said voids between said top surface and said bottom surface of said interposer frame, whereby said contacts are surrounded by said elastic and retained to said interposer by said elastic.

3. The interposer of claim 1, wherein said elastic is disposed partially around a periphery of a portion of said voids and said contacts, said portion being located within said voids between said top surface and said bottom surface of said interposer frame, whereby said contacts are surrounded by said elastic and retained to said interposer by said elastic.

4. The interposer of claim 1, wherein said contacts are spring contacts comprising a curved metal form.

5. The interposer of claim 4, wherein said elastic is disposed only within a central portion of said curved metal form and wherein said elastic is bonded to said interposer frame in a direction perpendicular to a direction of curvature of said contacts, whereby said contacts are retained.

6. The interposer of claim 5, wherein said elastic is adhered to said contacts, whereby said contacts are retained within said interposer frame.

7. The interposer of claim 5, wherein said elastic is a self-healing elastic, whereby said contacts are be inserted in said voids after cure of the elastic, whereby said contacts are retained by displacement of said elastic.

8. An interposer for providing electrical connections between lands of a Land Grid Array (LGA) device and corresponding lands of an electronic assembly, said interposer comprising:

an interposer frame comprising a substantially planar insulating sheet defining dumbbell-shaped voids through said insulating sheet perpendicular to a primary plane of the interposer frame, said voids provided for the insertion of contacts spaced in a grid-array;

a plurality of flexible C-shaped metal conductive contacts each having an arcuate first contact end and an arcuate second contact end, and wherein said contacts are inserted within and through the voids defined by said interposer frame such that said first contact extends above a top surface of said interposer frame and said second contact extends below a bottom surface of said interposer frame, and a gap of the C-shape is between the top surface and the bottom surface; and means for mechanically retaining said contacts to said interposer frame, whereby said contacts are mechanically retained to said interposer frame by said elastic which permits travel of said contacts in a direction perpendicular to said interposer frame.

9. The interposer of claim 8, wherein said contact retaining means is bonded to said contacts.

* * * * *